United States Patent [19]

Matsumoto et al.

[11] 4,172,724
[45] Oct. 30, 1979

[54] HOLOGRAM AND METHOD OF PRODUCTION THEREOF

[75] Inventors: Masakazu Matsumoto; Katsuhiko Nishide, both of Yokohama, Japan

[73] Assignee: Canon Kabushiki Kaisha, Tokyo, Japan

[21] Appl. No.: 819,584

[22] Filed: Jul. 27, 1977

[30] Foreign Application Priority Data

Jul. 27, 1976 [JP] Japan .................... 51-89488

[51] Int. Cl.² ............... G03C 5/24; G03C 5/04
[52] U.S. Cl. ................... 96/27 H; 96/48 R; 350/3.61; 427/53
[58] Field of Search ........ 96/27 H, 48 R, 67, 115 R; 427/53; 350/3.61

[56] References Cited

U.S. PATENT DOCUMENTS

| | | | |
|---|---|---|---|
| 3,567,444 | 3/1971 | Shankoff | 96/27 H |
| 3,660,091 | 5/1972 | Shankoff et al. | 96/49 |
| 3,703,371 | 12/1972 | Files | 96/27 H |
| 3,925,077 | 12/1975 | Lewis et al. | 96/35.1 |
| 4,049,459 | 9/1977 | Bloom et al. | 96/115 R |
| 4,055,423 | 10/1977 | Bartolini et al. | 96/27 H |

*Primary Examiner*—Edward C. Kimlin
*Attorney, Agent, or Firm*—Fitzpatrick, Cella, Harper and Scinto

[57] ABSTRACT

A hologram is produced by causing a crosslinking reaction in accordance with an interference pattern in a recording carrier composed of a polymer containing in its unit structure an aromatic or hetero cyclic ring having a reactive position capable of being substituted by radical.

10 Claims, 1 Drawing Figure

FIG. 1

HOLOGRAM AND METHOD OF PRODUCTION THEREOF

BACKGROUND OF THE INVENTION

1. Field of the Invention

The present invention relates to a hologram and more particularly a volume type phase hologram, and further to a method of producing same.

Holography is a unique technique of forming an optical image by which an object is irradiated by a well coherent wave such as laser where the wave is modulated in amplitude and phase in accordance with the shape of the object, the modulated wave reflected upon or transmitted through the object is recorded (=hologram) and the hologram is irradiated again by the laser so as to reproduce an optical image of the original object.

With the recent development of study on holography, it has been made clear to a certain extent what material is suitable for use in holography or what characteristics such a hologram recording material should have.

Thus, there have already been proposed various materials such as bleached silver salt (U.S. Pat. No. 3,672,744), dichromate gelatine (U.S. Pat. No. 3,617,274), photoresist, thermoplastic resin, inorganic glass materials and ferroelectric substances, and at present a further study on the characteristics of these materials is proceeding in the art.

2. Description of the Prior Art

The characteristics which a hologram recording material should have may be summarized as follows:

(1) to have a sensitivity to a laser, especially to a laser in the range of visible wavelength and to have a high sensitivity at the same time;
(2) to have a high resolving power;
(3) to give a hologram of high diffraction efficiency;
(4) to give a hologram of low noise level;
(5) to give a stable hologram; and
(6) to allow an easy recording and reproducing operation.

As will be seen from the above, the requirements for a hologram recording material are very severe ones In view of practical purposes, very few known hologram recording materials can satisfy the above requirements completely or at least partially to the extent that its use may be practical.

Among the above mentioned materials, bleached silver salt and dichromate gelatine may be considered to be practically usable. However, they have particular disadvantages. The former necessitates a bleaching treatment in addition to ordinary treatments and furthermore the hologram obtained from it is poor in light fastness. The latter has a difficulty regarding the preservation of hologram because the hologram obtained from this material lacks adequate stability against moisture.

SUMMARY OF THE INVENTION

Accordingly, the general object of the invention is directed to an improvement of hologram recording material as well as of manufacturing process thereof as to enable to provide a hologram with excellent properties.

More particularly, it is an object of the invention to provide a hologram produced from a recording material having a laser sensitivity in the visible wavelength range and a particular high sensitivity.

It is another object of the invention to provide a hologram of high resolving power.

It is a further object of the invention to provide a hologram of high diffraction efficiency.

It is still another object of the invention to provide a hologram having a good stability on standing.

Still a further object of the invention is to provide a method of producing a hologram having the above mentioned excellent properties.

It is still another object of the invention to provide a hologram of a thin thickness such as several microns having a high diffraction efficiency.

According to one aspect of the invention, there is provided a hologram characterized in that the hologram is produced by causing a crosslinking reaction in accordance with an interference pattern in a recording carrier composed essentially of a polymer containing in its unit structure an aromatic or heterocyclic ring which has therein a reactive position capable of being substituted by radical.

According another aspect of the invention, there is provided a method for producing a hologram, which is characterized by the steps of exposing a recording carrier to an interference pattern of radiant rays, the recording carrier being composed essentially of a polymer containing in its unit structure an aromatic or heterocyclic ring having therein a reactive position capable of being substituted by radical and also made to become active to radiation by a halogen containing compound; subjecting the exposed recording carrier to a swelling treatment with a first solvent; and subjecting the swollen recording carrier to a shrinking treatment with a second solvent.

Other and further objects, features and advantages of the invention will appear more fully from the following description.

BRIEF DESCRIPTION OF THE DRAWING

In the FIGURE, the single FIGURE shows diagrammatically an example of optical system used for producing a hologram according to the present invention.

DESCRIPTION OF THE PREFERRED EMBODIMENTS

The main component of hologram recording material used in the invention is a polymer containing in its unit structure an aromatic or heterocyclic ring having therein a reactive position capable of being substituted by radical.

Examples of such a polymer are addition polymer or copolymer of vinyl compound having in its structure an aromatic or heterocyclic ring, and the mixture thereof.

Another example is a condensation polymer of monomers, at least one kind of monomer of which is a compound having therein an aromatic or heterocyclic ring. The aromatic or heterocyclic ring may be substituted by substituent(s) such as halogen, alkyl, amino, nitro, cyano, thiocyano, carboxyl, alkoxy, acyl, sulfonyl and hydrogen.

Further examples of polymer used in the invention are: polystyrene, poly-p-methyl styrene, poly-α-methyl styrene, poly-p-divinyl benzene, poly-2,5-dichlorostyrene, styrene-acrylonitrile copolymer, styrene-divinyl benzene copolymer, styrene-butadiene copolymer, styrene-maleic anhydride copolymer, styrene-vinylidene chloride copolymer, styrene-acrylate-acrylamide copolymer, styrene-unsaturated polyester copolymer, styrene-glycidylmethacrylate copolymer, halogenated styrene polymer, styrenated oil, the mixture of polystyrene/styrene-butadiene copolymer, ABS resin, polyvinyl anisole, polyvinyl aniline, polyvinyl benzoate, polyvinyl stilbene, polyvinyl hydroquinone, poly-$\alpha,\beta$-vinyl naphthalene, polyacenaphthylene, polyvinyl anthracene, polyvinyl phenanthrene, polyvinyl pyrene, polyvinyl pyridine, polyvinyl pyrollidone, poly-N-vinyl phthalimide, polyvinyl indene, polyvinyl fluorene, polyvinyl furan, polyvinyl benzofuran, polyvinyl indole, polyvinyl indoline, polyvinyl oxazole, polyvinyl benzoxazole, polyvinyl thiazole, polyvinyl benzothiazole, polyvinyl thiophene, polyvinyl imidazole, polyvinyl pyrrole, polyvinyl pyrazole, polyvinyl triazole, polyvinyl tetrazole, polyvinyl benzimidazole, polyvinyl quinoline, polyvinyl dibenzofuran, polyvinyl thiazine, polyvinyl pyridazine, polyvinyl pyrimidine, polyvinyl pyrazine, polyvinyl triazine, polyvinyl carbazole, vinyl carbazole-styrene copolymer, vinyl carbazole-vinylidene chloride copolymer, vinyl carbazole-styrene copolymer, vinyl carbazole-methyl methacrylate, vinyl carbazole-vinyl anthracene copolymer, vinyl carbazole-vinyl pyridine copolymer, vinyl carbazole-acrylate copolymer, vinyl carbazole-ethyl acrylate copolymer, vinyl carbazole-acrylonitrile copolymer, vinyl carbazole-butyl acrylate copolymer, vinyl carbazole-nitrovinyl carbazole copolymer, nitrated polyvinyl carbazole, polyvinylamino carbazole, vinyl carbazole-N-methylaminovinyl carbazole copolymer, halogen substituted polyvinyl carbazole, vinyl carbazole-dibromovinyl carbazole copolymer, polyiodovinyl carbazole, polybenzylidenevinyl carbazole, polypropenyl carbazole, cumarone resin, cumarone-indene resin, phenol-formalin resin, cresol-formalin resin, modified phenol resin, phenol-furfural resin, resorcin resin, sulfonamide resin, aniline resin, xylene resin, toluene resin, glybuthal resin, modified glybuthal resin, terephthalic acid resin, isophthalic acid resin, maleic acid resin, poly(1,4-cyclohexylene dimestyrene) terephthalate, polydiallyl phthalate, polyallyl phosphonate, polycarbonate, polyallyldiglycol carbonate, polyphosphate, benzofuran resin, polyurethane resin, polyurea resin, epoxy resin, phenoxy type resin, polyphenylene oxide, halogen substituted polyphenylene oxide, polyphenylene, poly-p-xylilene, substituted polyxylilene, phenolsulfonic acid resin, phenolcarboxylic acid resin, thiokol resin, polythiokol-styrene resin.

The above mentioned polymers may be used alone or in the form of their mixture. The use of a polymer containing in its unit structure a carbazole ring is particularly preferable for the invention because it allows to produce very easily a hologram of high diffraction efficiency.

For the hologram recording material used in the invention, it is necessary to have been made preliminarily to become active to radiation by a halogen containing compound.

According to the present invention, the halogen containing compound generates radicals when irradiated by radiation rays, and the radicals cause a crosslinking reaction between the polymers.

The halogen containing compound used in the invention is a compound of such a structure which has in one molecule at least one carbon to which two or more halogen atoms are attached. Such a halogen-containing compound together with the above mentioned polymer constitutes a hologram recording material of relatively high sensitivity.

The most preferable halogen containing compound is a iodine containing compound. This compound is useful for preparing a very high sensitivity material, probably owing to a heavy atom effect of the iodine atoms present in the compound. Further, the iodine containing compound has a color tone of yellow to orange and therefore the sensitivity of a recording material prepared using this compound well covers the visible range of wavelength.

Examples of the halogen containing compound used in the invention are given below, for the purpose of illustration but not limitation:

$CI_4$, $CHI_3$, $CBr_4$, $CHBr_3$, $CCII_3$, $CBrI_3$, $CBr_3Cl$, $CBr_3I$, $CBr_2I_2$, $CH_2I_2$, $CHBrI_2$, $CHClI_2$, $CCl_2I_2$, $C_2Cl_6$, $C_2BrCl_5$, $CH_3CBr_3$, $CH_2BrCBr_3$, $CHBr_2CBr_3$, $CBr_3CBr_3$, $CBr_3CH_2OH$, $CH_3CI_3$, $CH_3CCl_2CCl_3$, $CCl_3CH_2CCl_3$, $CHCl_2CCl_2CCl_3$, $CCl_3CHClCCl_3$, $CCl_3CCl_2CCl_3$, $CH_3CBr_2CH_3$, $CH_3CHBrCBr_3$, $CH_2BrCH_2CBr_3$, $CH_3CBr_2CHBr_2$, $CH_2BrCBr_2CH_2Br$, $CBr_3CH_2CBr_3$, $CBr_3CHBrCBr_3$, $CHBr_2CH_2CHBr_2$, $CHBr_2CHBrCHBr_2$, $CHBr_2CBr_2CHBr_2$, $CH_3CH_2CBr_3$, $CH_3CHBrCHBr_2$, $CH_3CI_2CH_3$, $CH_3CHCH_2I$, $CH_3CI_2CHI_2$, $C_2H_5CHI_2$, $CHBr_2—CHOH—CHBr_2$, $CH_3CHOHCBr_3$, $C_2H_5CI_3$, $CClBr=CClBr$, $CBr_2=CBr_2$, $CH_2=CI_2$, $CClI=CClI$, $CBrI=CBrI$, $CI_2=CI_2$, $C_6H_5CBr_3$, $C_6H_5CCl_3$, $C_6H_5COCBr_3$, $C_6H_5COCCl_3$, $CBr_3SOCBr_3$, $CBr_3SOCHBr_2$, $CBr_3SO_2CBr_3$, $C_6H_5SO_2CBr_3$, $CHBr_2SO_2CHBr_2$, $CH_2BrSO_2CHBr_2$, $P—Cl—C_6H_4SO_2CCl_3$, $P—NO_2—C_6H_4SO_2CBr_3$, 2-trichloromethylbenzothiazolylsulfone-2, 4,6-dimethylpyrimidyl-2-tribromomethyl sulfone, 2,4-dichlorophenyltrichloromethyl sulfone, 2-methyl-4-chlorophenyltrichloromethyl sulfone, 2,5-dimethyl-4-chlorophenyltrichloromethyl sulfone, 2,4-dichlorophenyltribromomethyl sulfone.

In preparing the hologram recording sensitive material (that is also referred to simply as sensitive member) used in the invention, the above mentioned polymer and the halogen containing compound together in a predetermined mixing ratio are dissolved or dispersed in a suitable solvent. Then, the resultant solution or dispersion is coated onto a support such as glass plate or transparent resin film. Otherwise, when the resultant composition has a good film forming property, it is made a film by itself so as to form a sensitive member for hologram.

The mixing ratio of the halogen containing compound to the polymer may vary in a wide range. The use of the halogen containing compound in an amount of from 0.1 to 200 wt% and more preferably 0.5 to 50 wt% based on the weight of the polymer is recommended.

If the polymer used is poor in film forming property, there may be added a plasticizer. Also, an antioxidant may be added when the halogen containing compound used lacks sufficient stability.

Examples of a suitable plasticizer include terphenyl, chlorinated diphenyl, chlorinated naphthalene, chlorinated paraffin, thiokol resin, polycarbonate resin, epoxy resin and cumarone indene resin. As antioxidant, almost any known antioxidants such as substituted phenols may be used for this purpose.

The sensitive member prepared in the above described manner has many excellent properties. For example, it is sensitive to those lasers which have bright lines at 4416 Å, 4579 Å, 4762 Å, 4765 Å, 4880 Å, 5145

Å, 5208 Å, and 5308 Å. In addition, its sensitivity is very high, for example, to the extent that for 4880 Å bright line of an argon laser, a practicable grade of diffraction efficiency is obtainable only by 10 mJ/cm² of exposure energy.

The process for producing a hologram by using the above described sensitive member comprises the steps of exposing it to a radiant ray and developing the exposed member with two different kinds of solvents.

As the radiant ray, a laser beam or radiation emitted from a mercury lamp or the like is preferably used in the invention. The formation of a hologram is effected by irradiating the surface of the sensitive member by two coherent radiation beams at a predetermined offset angle to thereby control the degree of the crosslinking reaction in accordance with the interference pattern.

Development generally comprises two steps of swelling and shrinking. Swelling is a step in which the sensitive member carrying a hologram latent image formed by the above described exposure is immersed in a bath of swelling liquid so as to remove the unreacted halogen containing compound by dissolution and cause a difference of degree of swelling in accordance with the hologram pattern formed by the crosslinking reaction, that is, a difference of degree of the crosslinking reaction. Shrinking is a step in which the hologram is fixed in accordance with the swollen state of the member by using a second solvent that has no swelling action to the member.

The swelling liquid used in the invention is such a solvent which never brings to an infinitely swollen state a polymer containing in its structure an aromatic or heterocyclic ring as well as a cross linkage product resulted from the photoreaction of the polymer and a halogen containing compound.

Examples of solvents usable for this purpose are:

derivatives of benzene and naphthalene such as benzene, toluene, xylene, ethylbenzene, n-propylbenzene, cumene, phenol, cresol, chlorobenzene, dichlorobenzene, nitrobenzene, benzyl alcohol, benzyl chloride, benzyl bromide, α-methylnaphthalene and α-chloronaphthalene.

These examples include solvents which have a dissolving action or no swelling action on at about room temperature the polymer for preparing a photosensitive layer. But, it becomes possible to use these solvents as swelling liquid by changing the temperature set for development. For example, the former solvent (having a dissolving action at room temperature) is used at a lower temperature while the latter solvent (no swelling action) is used at a higher temperature.

Shrinking liquid used in the invention is such a solvent which is miscible with the above described swelling liquid and has not any swelling or dissolving action to the photosensitive layer. Many of the known solvents can satisfy the above requirement and are therefore useful for the invention.

Examples of such a solvent include alkanes and cycloalkanes such as n-pentane, n-hexane, n-heptane, n-octane, iso-octane and cyclohexane; alcohols such as methyl alcohol, ethyl alcohol, n-propyl alcohol, iso-propyl alcohol, n-butyl alcohol, tert-butyl alcohol, n-amyl alcohol and iso-amyl alcohol; ethers such as diethyl ether, methyl ethyl ether and diiso-propyl ether; ketones such as acetone and methyl ethyl ketone; and esters such as ethyl acetate, methyl acetate, ethyl formate and methyl propionate.

By carrying out a series of processes as described above, a volume type phase hologram can be produced, which has many excellent properties.

The hologram is colorless and has a high transparency. The maximum diffraction efficiency can reach up to 90% and a high resolving power over 3500 lines/mm is attainable. Furthermore, its stability against moisture and light is excellent.

Thus, according to the invention, there is provided a hologram excellent in property and characteristics, compared with that of holograms produced from the conventional sensitive material for hologram.

Figure 1:
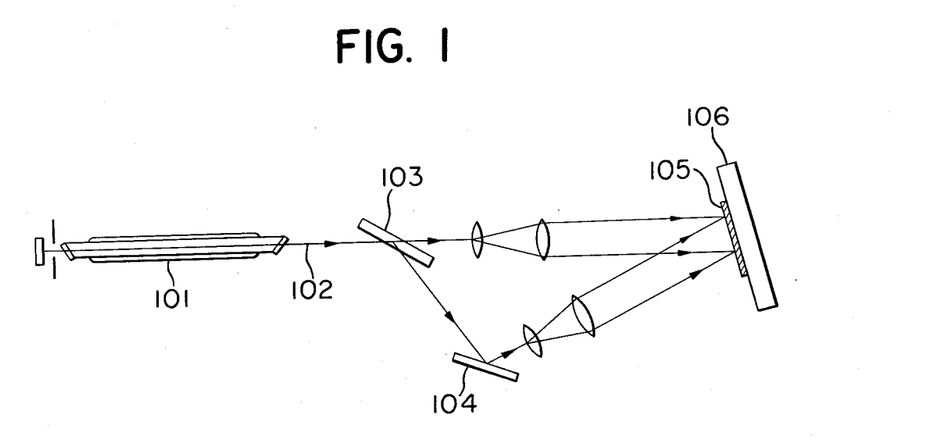

Referring to FIG. 1, a radiation ray source 101 emits a coherent beam 102. The coherent beam is divided into two beams by a beam splitter 103 and one beam directly passes an optical lens system and is enlarged to form a parallel ray while the other beam is reflected by a reflecting mirror 104, passes another optical lens system, and is enlarged to form a parallel ray. A sensitive member 105 placed on a light absorption plate coated with a reflection preventing point is exposed to an interference pattern of the two parallel rays.

The following examples are given for the purpose of illustrating the present invention.

EXAMPLE 1

2.0 g of polyvinyl carbazole, 0.2 g of carbon tetraiodide and 20 mg of 2,6-di-tert-butylphenol were dissolved in 25 g of monochlorobenzene and the resultant solution was coated onto the polished surface of a glass plate 1.0 mm thick with a spinner (1H-2 type spinner, made by MIKASA Co. Ltd.,) in the dark. After air-drying in the dark, there was obtained a sensitive material for hologram in the thickness of about 4μ.

The spectral sensitivity range of the photosensitive member thus obtained was measured by using Grating Spectrograph, RM-23-1 (manufactured by NALUMI Co. Ltd.,) and found to have a sensitivity in the visible range extending to 5400 Å at long wavelength side. The sensitive member was exposed to an argon laser at 5146 Å bright line employing an optical system as shown in the drawing at the offset angle of 70° and in the ratio of light intensity of 1:1. The intensity of light as sum of two beams was 3 mW/cm² just before the incidence.

The sensitive member thus exposed to an interference pattern was immersed in a bath of xylene at 40° C. and for two minutes so as to remove the photosensitive element from it and also to swell it. Thereafter, it was washed and shrunk with a shrinking liquor of n-hexane.

In this manner, a volume type phase hologram was produced, which has a spatial frequency of about 3000 lines/mm at wavelength 5146 Å. Its diffraction efficiency reached maximum at the time of exposure energy 30 mJ/cm² and its value was found to be 90% at the same reading wavelength as that of exposure.

To evaluate the moisture and heat resistance of the above hologram, it was allowed to stand under the condition of a temperature of 70° C. and a humidity of 100% R.H. Even after the elapse of one month, there was not observed any change in characteristics of the hologram.

Further, a light fastness (stability against light) test was conducted on the hologram. In the test, the hologram plate was placed under a 500 W mercury lamp at the distance of 20 cm and subjected to an irradiation of the lamp for 5 hours. The result of the test was that the hologram plate was only very slightly colored in yellow but there was not observed any change in characteristics of the hologram.

Here, referring to FIG. 1 that is the single FIGURE of the accompanying drawing, the reference numeral 101 designates a laser generator, 102 is a laser, 103 is a beam splitter, 104 is a reflecting mirror, 105 is a hologram recording photosensitive material (sensitive member) and 106 designates a light absorption plate.

EXAMPLES 2–6

The procedure described in Example 1 was repeated except that polymers listed in Examples 2–6 in the table were used in place of polyvinylcarbazole.

In this manner, holograms of Examples 2 through 6 were produced, respectively.

Various data of properties of these hologram are given below in the table including the data of hologram of Example 1.

The exposure energy used was 30 mJ/cm² for all the cases.

that the upper limit of its sensitivity range was at 4800 Å.

The sensitive member was exposed in the same manner as Example 1 by using a 4579 Å bright line of an argon laser. The exposed member was then immersed in a mixture (1:1) of m-cresol and methyl acetate at 30° C. for two minutes so as to remove the iodoform and also to have the member swollen. Thereafter, it was subjected to a washing and shrinking treatment with isopropyl alcohol. In this manner, a volume type phase hologram was produced, which had a spatial frequency of about 3600 lines/mm, a diffraction efficiency of 75% and a transmittance of 89% (exposure energy 100 mJ/cm²).

The stability of the hologram was tested in the same manner as in Example 1. The hologram was somewhat inferior in heat-resisting property to that of Example 1, but in other properties it exhibited almost equal excellency to the latter.

| Example No. | Polymer | Upper limit of spectral sensitivity range (Å) | Diffraction efficiency (%) | Transmittance (%) | Moisture-heat resistance | Light fastness | Remarks |
| --- | --- | --- | --- | --- | --- | --- | --- |
| 1 | Polyvinyl carbazole | 5400 | 90.2 | 88 | unchanged | unchanged | |
| 2 | Chlorinated poly-vinyl carbazole | 5350 | 62.3 | 86 | unchanged | slightly colored in yellow; diffraction efficiency unchanged | |
| 3 | Mixture (1:1) of clorinated poly-vinyl carbazole and polyvinyl carbazole | 5350 | 70.1 | 88 | unchanged | almost unchanged | Mixture (1:1) of photosensitive compositions of Examples 1 and 2 |
| 4 | Vinyl carbazole-styrene copolymer | 5300 | 68.2 | 89 | almost unchanged | unchanged | M.W. about 300 thousand |
| 5 | Mixture (1:1) of vinyl carbazole-styrene copolymer and polyvinyl carbazole | 5400 | 77.2 | 89 | unchanged | unchanged | Mixture (1:1) photosensitive compositions of Examples 1 and 4 |
| 6 | Vinyl carbazole-vinyl pyridine copolymer | 5280 | 51.7 | 88 | unchanged | unchanged | M.W. about 250 thousand |

EXAMPLE 7

By using a photosensitive composition prepared by dissolving 2.0 g of polystyrene and 0.3 g of iodoform in 25 g of toluene, a sensitive member for hologram in the thickness of 4.5μ was produced in the same manner as Example 1.

The spectral sensitivity range was measured according to the procedure described in Example 1 and found

EXAMPLES 8–14

The procedure of Example 7 was repeated except that polymers listed in Examples 8–14 were used in place of polystyrene to produce volume type phase holograms of Examples 8–14, respectively.

Various data of properties of these holograms were given in the following table including the data of hologram of Example 7.

| Example No. | Polymer | Upper limit of spectral sensitivity range (Å) | Exposure energy (mj/cm²) | Diffraction efficiency (%) | Transmittance | Remarks |
| --- | --- | --- | --- | --- | --- | --- |
| 7 | Polysturene | 4800 | 100 | 75.3 | 89 | |
| 8 | Poly-P-chlorostyrene | 4850 | 150 | 55.9 | 86 | M.W. about 200 thousand |
| 9 | Mixture (1:1) of polystyrene and poly-P-chlorostyrene | 4850 | 150 | 62.1 | 87 | Mixture (1:1) of photosensitivity compositions of Examples 7 and 8 |
| 10 | Poly-P-methyl | 4800 | 180 | 66.6 | 89 | M.W. about 160 |

-continued

| Example No. | Polymer | Upper limit of spectral sensitivity range (A) | Exposure energy (mj/cm$^2$) | Diffraction efficiency (%) | Transmittance | Remarks |
| --- | --- | --- | --- | --- | --- | --- |
| 11 | styrene Mixture (1:1) of polystyrene and poly-P-methyl styrene | 4800 | 150 | 65.3 | 88 | thousand Mixture (1:1) of photosensitivity compositions of Examples 7 and 10 M.W. about 220 |
| 12 | Styrene-vinylidene chloride copolymer | 4700 | 200 | 47.2 | 87 | thousand M.W. about 350 |
| 13 | Styrene-divinyl benzene copolymer | 4750 | 120 | 70.1 | 88 | thousand ABS resin: commercial available composition, M.W. 360 thousand |
| 14 | Mixture (1:2) of ABS resin and polystyrene | 4780 | 200 | 49.8 | 84 | |

EXAMPLE 15

2.0 g of polyacenaphthylene (m.w. about 280,000) and 0.5 g of carbon tetrabromide were dissolved in 25g of dioxane. By using the resultant photosensitive composition, a sensitive member for hologram 6.1μ thick was produced in the same manner as in Example 1.

The sensitive member was exposed in the conventional manner employing a 3511 Å bright line of argon laser (exposure energy: 120 mJ/cm$^2$). The exposed member was then immersed in a bath of toluene at 0° C. for two minutes so as to remove the carbon tetrabromide and also to have the member swollen. Thereafter, it was subjected to a washing and shrinking treatment with cyclohexane.

In this manner, a volume type phase hologram was produced, which was measured and found to have a diffraction efficiency of 69.0% (measured at wavelength 4879 Å) and a transmittance of 88.5%.

EXAMPLE 16

2.0 g of poly-α,β-vinylnaphthalene (m.w. about 160,000) and 0.2 g of 1,1,1triiodoethane were dissolved in 25 g of benzene. By using the resultant photosensitive composition, a sensitive member for hologram 5.2μ thick was produced in the same manner as in Example 1.

The sensitive member was exposed in the conventional manner employing a 4416 Å bright line of He—Cd laser (exposure energy: 150 mJ/cm$^2$). The exposed member was then immersed in a bath of cumene at 20° C. for two minutes so as to remove the triiodoethane and also to have the member swollen. Thereafter, it was subjected to a washing and shrinking treatment with methanol.

In this manner, a volume type phase hologram was produced, which was measured and found to have a diffraction efficiency of 49.3% (measured at wavelength 4879 Å) and a transmittance of 89%.

EXAMPLE 17

2.0 g of polyvinylindene (m.w. about 220,000) and 0.4 g of hexabromoethane were dissolved in 25 g of tetrahydrofuran. By using the resultant photosensitive composition, a sensitive member for hologram 4.3μ thick was produced in the same manner as Example 1.

The sensitive member was exposed in the conventional manner employing a 3564 Å bright line of Ar—Kr laser (exposure energy: 100 mJ/cm$^2$). The exposed member was then immersed in a bath of chlorobenzene at 5° C. for two minutes so as to remove the hexabromoethane and also to have the member swollen. Thereafter, it was subjected to a washing and shrinking treatment with diisopropyl ether.

In this manner, a volume type phase hologram was produced, which was measured and found to have a diffraction efficiency of 55.2% and a transmittance of 88%.

EXAMPLE 18

1.0 g of polyvinylpyrollidone (m.w. about 360,000), 1.0 g of polyvinylimidazole (m.w. about 210,000), and 0.3 g of iodoform were dissolved in 25 g of dioxane. The resultant photosensitive composition was coated onto a polyester film with a wire round bar in the dark and a sensitive film for hologram 3.0μ thick was produced after natural drying.

The sensitive film was exposed employing an optical system as shown in FIG. 1 with a 4879 Å bright line of argon laser (exposure energy: 200 mJ/cm$^2$). The exposed film was then immersed in a bath of benzene at 40° C. for two minutes so as to remove the iodoform and also to have the film swollen. Thereafter, it was subjected to a washing and shrinking treatment with isooctane.

In this manner, a volume type phase hologram was produced, which was measured and found to have a diffraction efficiency of 72.0% (measured at wavelength 4879 Å) and a transmittance of 89%.

As to durability of the hologram, the light fastness and the thermal resistance were good although its moisture resistance was somewhat reduced.

EXAMPLE 19

2.0 g of polyvinyldibenzofuran (m.w. about 180,000) and 0.2 g of hexabromodimethylsulfone were dissolved in 25 g of tetrahydrofuran. By using the resultant photosensitive composition, a sensitive film for hologram 3.5μ thick was produced in the same manner as in Example 18.

The sensitive film was exposed in the conventional manner employing a 3638 Å bright line of argon laser (exposure energy: 150 mJ/cm$^2$). The exposed film was then immersed in a bath of nitrobenzene at 50° C. for three minutes so as to remove the hexabromodimethylsulfone and also to have the film swollen. Thereafter, it was subjected to a washing and shrinking treatment with n-heptane.

In this manner, a volume type phase hologram was produced, which was measured and found to have a diffraction efficiency of 57.8% and a transmittance of 86%.

EXAMPLE 20

1.0 g of polyvinylpyridine (m.w. about 380,000), 1.0 g of polyvinylbenzoxazole (m.w. about 260,000), 0.2 g of ethylene tetraiodide and 0.1 g of 4,4'-butylidene bis(3-methyl-6-tert-butylphenol) were dissolved in 25 g of dioxane. By using the resultant photosensitive composition, a sensitive film for hologram 2.8µ thick was produced in the same manner as in Example 18.

The sensitive film was exposed in the conventional manner employing a 4879 Å bright line of argon laser (exposure energy: 10 mJ/cm²). The exposed film was then immersed in a bath of n-propylbenzene at 35° C. for two minutes so as to remove the ethylene tetraiodide and also to have the film swollen. Thereafter, it was subjected to a washing and shrinking treatment with n-hexane.

In this manner, a volume type phase hologram was produced, which was measured and found to have a diffraction efficiency of 41.7% and a transmittance of 86%.

EXAMPLES 21-34

The procedure of Example 20 was repeated with the change that polyvinyl pyridine and polyvinyl benzoxazole used in Example 20 were replaced by various polymers containing a heterocyclic ring respectively as shown in the following table.

In this manner, volume type phase holograms of Examples 21 through 34 were produced, the properties of which are summarized in the following table.

then immersed in a bath of methylnaphthalene at 50° C. for two minutes so as to remove the iodoform and also to have the film swollen. Thereafter, it was subjected to a washing and shrinking treatment with n-hexane.

In this manner, a volume type phase hologram was produced, which was measured and found to have a diffraction efficiency of 70.9% (measured at wavelength 4579 Å) and a transmittance of 87.0%.

The hologram was excellent in durability and superior to that of Example 1. Especially, its excellent stability to solvent was distinguished over others.

EXAMPLE 36

2.0 g of terpenephenol resin and 0.6 g of hexachloroethane were dissolved in 25 g of chlorobenzene. By using the resultant photosensitive composition, a sensitive member for hologram 4.5µ thick was produced in the same manner as in Example 1.

The sensitive member was exposed in the conventional manner employing a 3511 Å bright line of argon laser (exposure energy: 300 mJ/cm²). The exposed member was then immersed in a bath of ethylbenzene at 25° C. for two minutes so as to remove the hexachloroethane and also to have the member swollen. Thereafter, it was subjected to a washing and shrinking treatment with ether.

In this manner, a volume type phase hologram was produced, which was measured and found to have a diffraction efficiency of 48.2% (measured at wavelength 4879 Å) and a transmittance of 85.0%.

EXAMPLE 37

2.0 g of polybenzimidazole prepared by fusion polycondensation of 3,3'-diaminobenzidine and diphenyl isophthalate and 0.3 g of iodoform were dissolved in 25 g of dimethylformamide. By using the resultant photosensitive composition, a sensitive member for hologram

| Example No. | Polymer | Exposure energy (mJ/cm²) | Diffraction efficiency (%) | Transmittance (%) | Remarks |
|---|---|---|---|---|---|
| 21 | Polyvinyl furan | 40 | 52.3 | 87.7 | |
| 22 | Polyvinyl thiophene | 100 | 49.8 | 88.0 | slightly colored |
| 23 | Polyvinyl pyrrole | 50 | 39.7 | 86.0 | easily peeled |
| 24 | Polyvinyl oxazole | 60 | 62.3 | 88.0 | |
| 25 | Polyvinyl thiazole | 60 | 58.3 | 87.5 | |
| 26 | Polyvinyl pyrazole | 80 | 43.2 | 88.5 | |
| 27 | Polyvinyl triazole | 40 | 55.5 | 87.5 | not well in film forming property |
| 28 | Polyvinyl oxazine | 100 | 43.2 | 88.0 | |
| 29 | Polyvinyl triazine | 50 | 60.1 | 87.5 | |
| 30 | Polyvinyl pyrimidine | 40 | 67.3 | 88.0 | |
| 31 | Polyvinyl pyrazine | 80 | 43.7 | 88.0 | |
| 32 | Polyvinyl tetrazole | 60 | 50.8 | 88.0 | |
| 33 | Polyvinyl thiazine | 100 | 50.2 | 87.0 | slightly colored in yellow by exposure |
| 34 | Polyvinyl pyridazine | 50 | 58.3 | 87.5 | |

EXAMPLE 35

2.0 g of poly-p-xylylene, 0.2 g of iodoform and 10 mg of 2,5-di-tert-butylhydroquinone were dissolved under heating in 32 g of α-chloronaphthalene.

The resultant photosensitive composition was coated onto a teflon plate with good surface property in the dark with a wire round bar and, after drying the coating film by heating under a reduced pressure for 2 hours, it was peeled from the teflon plate. Thus, a film for hologram 20µ thick was produced.

The film was exposed employing an optical system as shown in FIG. 1 with a 4579 Å bright line of argon laser (exposure energy: 200 mJ/cm²). The exposed film was 4.9µ thick was produced in the same manner as Example 1.

The sensitive member was exposed in the conventional manner employing a 4579 Å bright line of argon laser (exposure energy: 80 mJ/cm²). The exposed member was then immersed in a bath of benzylalcohol at 50° C. for two minutes so as to remove the iodoform and also to have the member swollen. Thereafter, it was subjected to a washing and shrinking treatment with n-hexane.

In this manner, a volume type phase hologram was produced, which was measured and found to have a diffraction efficiency of 43.3% (measured at wavelength 4879 Å) and a transmittance of 85.2%.

EXAMPLES 38–42

The procedure of Example 37 was repeated employing various polymers as shown in the following table instead of polybenzimidazole used in Example 37 and also various different swelling solvents as shown in the table.

In this manner, volume type phase holograms of Examples 38 through 42 were produced, the properties of which are summarized in the following table.

| Example No. | Polymer | Swelling liquid | Exposure energy (mJ/cm$^2$) | Diffraction efficiency (%) | Transmittance (%) |
|---|---|---|---|---|---|
| 38 | epoxy resin | 0° C. xylene | 150 | 37.2 | 86.0 |
| 39 | polyurethane | 0° C. xylene | 150 | 33.3 | 80.5 |
| 40 | polycarbonate | 20° C. methylene chloride-m-cresol (1:1) | 300 | 39.0 | 89.0 |
| 41 | xylene resin | 20° C. toluene | 100 | 52.3 | 88.0 |
| 42 | cumarone-indene resin | 20° C. dichlorobenzene | 120 | 47.1 | 87.5 |

What we claim is:

1. A method of producing a hologram comprising the steps of:
   exposing a recording carrier to an interference pattern of radiant rays, said recording carrier being composed essentially of (1) a polymer containing in its unit structure an aromatic or heterocyclic ring having therein a reactive position capable of being substituted by a radical and (2) a halogen containing compound wherein said polymer and halogen containing compound are crosslinked responsive to said interference pattern;
   subjecting the exposed recording carrier to a swelling treatment with a first solvent said first solvent dissolving unreacted halogen containing compound; and
   subjecting the swollen recording carrier to a shrinking treatment with a second solvent.

2. A method of producing a hologram as claimed in claim 1, wherein said halogen containing compound is used in an amount of from 0.1 to 200 percent by weight based on the weight of said polymer.

3. A method of producing a hologram as claimed in claim 1, wherein said halogen containing compound is used in an amount of from 0.5 to 50 percent by weight based on the weight of said polymer.

4. A method of producing a hologram as claimed in claim 1, wherein said halogen containing compound is a compound of such a structure which has in one molecule at least one carbon to which two or more halogen atoms are attached.

5. A method of producing a hologram as claimed in claim 1, wherein said halogen containing compound is a iodine substituted compound of hydrocarbon containing two or less carbon atoms.

6. A method of producing a hologram as claimed in claim 1, wherein said halogen containing compound is a iodine containing compound.

7. A method of producing a hologram as claimed in claim 1, wherein said radiant ray is a laser.

8. A method of producing a hologram as claimed in claim 1, wherein said radiant ray is a laser with its bright line being in the visible range of wavelength.

9. A method of producing a hologram as claimed in claim 1, wherein said recording carrier is hardly dissolved out into said first and second solvents.

10. A hologram produced by exposing a recording carrier to an interference pattern of radiant rays, said recording carrier being composed essentially of (1) a polymer containing in its unit structure an aromatic or heterocyclic ring having therein a reactive position capable of being substituted by a radical and (2) a halogen containing compound wherein said polymer and halogen containing compound are crosslinked responsive to said interference pattern;
   subjecting the exposed recording carrier to a swelling treatment with a first solvent, said first solvent dissolving unreacted halogen containing compound; and
   subjecting the swollen recording carrier to a shrinking treatment with a second solvent.

* * * * *

UNITED STATES PATENT AND TRADEMARK OFFICE
CERTIFICATE OF CORRECTION

PATENT NO. : 4,172,724

DATED : October 30, 1979

INVENTOR(S) : Masakazu Matsumoto, et al

It is certified that error appears in the above-identified patent and that said Letters Patent are hereby corrected as shown below:

Col. 2, line 41, "FIGURE" 1st occurrence should be -- DRAWING --.

Cols. 7 & 8, lines 20-45, the table should read as follows:

| Example No. | Polymer | Upper limit of spectral sensitivity range (Å) | Diffraction efficiency (%) | Transmittance (%) | Moisture-heat resistance | Light fastness | Remarks |
|---|---|---|---|---|---|---|---|
| 1 | Polyvinyl carbazole | 5400 | 90.2 | 88 | unchanged | unchanged | |
| 2 | Chlorinated polyvinyl carbazole | 5350 | 62.3 | 86 | unchanged | slightly colored in yellow; diffraction efficiency unchanged | |
| 3 | Mixture (1:1) of chlorinated polyvinyl carbazole and polyvinyl carbazole | 5350 | 70.1 | 88 | unchanged | almost unchanged | Mixture (1:1) of photosensitive compositions of Examples 1 and 2 |
| 4 | Vinyl carbazole-styrene copolymer | 5300 | 68.2 | 89 | almost unchanged | unchanged | M.W. about 300 thousand |
| 5 | Mixture (1:1) of vinyl carbazole-styrene copolymer and polyvinyl carbazole | 5400 | 77.2 | 89 | unchanged | unchanged | Mixture (1:1) of photosensitive compositions of Examples 1 and 4 |
| 6 | Vinyl carbazole-vinyl pyridine copolymer | 5280 | 51.7 | 88 | unchanged | unchanged | M.W. about 250 thousand |

UNITED STATES PATENT AND TRADEMARK OFFICE
CERTIFICATE OF CORRECTION

PATENT NO. : 4,172,724

DATED : October 30, 1979

INVENTOR(S) : Masakazu Matsumoto, et al.

It is certified that error appears in the above—identified patent and that said Letters Patent is hereby corrected as shown below:

Cols. 7 & 8, lines 57-68, the table should read as follows:

| Example No. | Polymer | Upper limit of spectral sensitivity range (Å) | Exposure energy ($mj/cm^2$) | Diffraction efficiency (%) | Transmittance | Remarks |
|---|---|---|---|---|---|---|
| 7 | Polystyrene | 4800 | 100 | 75.3 | 89 | |
| 8 | Poly-P-chlorostyrene | 4850 | 150 | 55.9 | 86 | M.W. about 200 thousand |
| 9 | Mixture (1:1) of polystyrene and poly-P-chlorostyrene | 4850 | 150 | 62.1 | 87 | Mixture (1:1) of photosensitivity compositions of Examples 7 and 8 |
| 10 | Poly-P-methyl styrene | 4800 | 180 | 66.6 | 89 | M.W. about 160 thousand |
| 11 | Mixture (1:1) of polystyrene and poly-P-methyl styrene | 4800 | 150 | 65.3 | 88 | Mixture (1:1) of photosensitivity compositions of Examples 7 and 10 |
| 12 | Styrene-vinylidene chloride copolymer | 4700 | 200 | 47.2 | 87 | M.W. about 220 thousand |
| 13 | Styrene-divinyl benzene copolymer | 4750 | 120 | 70.1 | 88 | M.W. about 350 thousand |
| 14 | Mixture (1:2) of ABS resin and polystyrene | 4780 | 200 | 49.8 | 84 | ABS resin: commercial available composition, M.W. 360 thousand |

Signed and Sealed this

Fourth Day of November 1980

[SEAL]

Attest:

SIDNEY A. DIAMOND

Attesting Officer

Commissioner of Patents and Trademarks